(12) United States Patent
Lu et al.

(10) Patent No.: US 12,495,503 B2
(45) Date of Patent: Dec. 9, 2025

(54) METHOD FOR ADJUSTING FLUX DISTRIBUTION POSITIONS ON CIRCUIT BOARD

(71) Applicant: JETBEST CORPORATION, Hsinchu (TW)

(72) Inventors: Yi-Ching Lu, Hsinchu (TW);
Shih-Chieh Huang, Hsinchu (TW);
Wen-Han Tzeng, Hsinchu (TW)

(73) Assignee: JETBEST CORPORATION, Hsinchu (TW)

( * ) Notice: Subject to any disclaimer, the term of this patent is extended or adjusted under 35 U.S.C. 154(b) by 0 days.

(21) Appl. No.: 19/011,778

(22) Filed: Jan. 7, 2025

(65) Prior Publication Data
US 2025/0318054 A1   Oct. 9, 2025

(30) Foreign Application Priority Data
Apr. 9, 2024   (TW) ................. 113113172

(51) Int. Cl.
*B23K 1/00*   (2006.01)
*B23K 1/20*   (2006.01)
*H05K 3/26*   (2006.01)
*H05K 3/34*   (2006.01)
*B23K 101/42*   (2006.01)

(52) U.S. Cl.
CPC ............. *H05K 3/26* (2013.01); *B23K 1/203* (2013.01); *B23K 1/206* (2013.01); *H05K 3/3489* (2013.01); *B23K 2101/42* (2018.08); *H05K 2203/107* (2013.01)

(58) Field of Classification Search
CPC ... B23K 2101/40; B23K 26/03; G02B 6/4238
See application file for complete search history.

(56) References Cited

U.S. PATENT DOCUMENTS

| | | | |
|---|---|---|---|
| 5,013,366 A * | 5/1991 | Jackson | C23G 5/00 134/40 |
| 6,597,444 B1 * | 7/2003 | Halderman | G01N 21/8422 356/237.1 |
| 2002/0053589 A1 * | 5/2002 | Owen | B23K 3/08 228/8 |
| 2005/0225754 A1 * | 10/2005 | Ume | G01N 21/95607 356/237.1 |
| 2006/0226381 A1 * | 10/2006 | Kawabe | B23K 26/066 250/559.36 |

(Continued)

*Primary Examiner* — Erin B Saad

(57) ABSTRACT

A method for adjusting flux distribution positions on a circuit board is provided. The method includes: preparing a circuit board with a plurality of soldering joints distributed on its surface and applying a layer of flux to cover the soldering joints; performing optical alignment by transferring the circuit board to a working area, capturing an image of the circuit board with an optical camera, and calculating position information; performing laser cleaning by utilizing a laser generator to emit laser light and remove excess flux around the soldering joints based on the position information, leaving flux only on the top surfaces of the soldering joints; and conducting automated optical inspection to verify whether the circuit board is defective. This method ensures precise flux distribution on the solder joints' top surfaces, enhancing the quality and reliability of subsequent soldering processes.

10 Claims, 6 Drawing Sheets

(56) References Cited

U.S. PATENT DOCUMENTS

2007/0292957 A1* 12/2007 Chua .................. G01N 15/0826
427/58
2016/0252688 A1* 9/2016 Barwicz ............... G02B 6/1225
385/14
2019/0339212 A1* 11/2019 Zhang ..................... G06T 7/001

* cited by examiner

METHOD FOR ADJUSTING FLUX DISTRIBUTION POSITIONS ON CIRCUIT BOARD

CROSS-REFERENCE TO RELATED APPLICATION

This application claims the priority of Taiwanese patent application No. 113113172, filed on Apr. 9, 2024, which is incorporated herewith by reference.

BACKGROUND OF THE INVENTION

1. Field of the Invention

This invention pertains to the technical field of flux application on circuit boards, with a specific focus on a method for precisely adjusting the distribution of flux on circuit board soldering joints.

2. The Prior Arts

Flux plays a critical role in soldering by chemically removing oxides from metal surfaces at the joints to be soldered. It enhances wet ability and ensures the solder forms a robust bond by firmly attaching to the metal interface between the soldered objects.

In semiconductor manufacturing, certain circuit boards require the use of solder bump technology for subsequent soldering processes. This involves applying flux to multiple soldering joints on the circuit board. Solder balls are then placed on the flux-coated joints and heated in a reflow furnace, forming raised solder bumps.

As electronic components continue to miniaturize, circuit board wiring patterns have become more compact, resulting in narrower spacing between solder bumps. This requires flux distribution to be more precise. However, current methods like inkjet spraying or screen printing often result in flux diffusion or oversized distribution areas. This excess flux can interfere with subsequent solder bump formation. Therefore, an effective method is needed to precisely control flux distribution, removing excess flux from undesired areas while retaining it only on soldering joints, thus ensuring accurate solder bump formation.

SUMMARY OF THE INVENTION

The primary objective of this invention is to provide a method for precisely adjusting the distribution of flux on a circuit board. By employing optical alignment and laser cleaning, excess flux around the soldering joints is removed, leaving flux only on the joints. This method overcomes conventional issues of flux spreading or overly large distribution areas, achieving the precision required for advanced packaging processes.

To achieve this objective, the invention employs the following technical solutions:

This invention provides a method for adjusting the distribution of flux on a circuit board, comprising the following steps:

1. Preparing a circuit board with multiple soldering joints and applying a layer of flux covering the soldering joints.
2. Performing optical alignment by capturing images of the circuit board using an optical camera, calculating positional information, and outputting the data.
3. Performing laser cleaning by using a laser generator to remove excess flux based on positional data, ensuring flux remains only on the soldering joints.
4. Conducting automated optical inspection to identify any defects on the circuit board.

In a preferred embodiment, the flux initially covers multiple soldering joints simultaneously.

In another embodiment, each soldering joint is coated with flux, with the coverage area exceeding the joint size.

The flux can be applied using an inkjet method.

The thickness of the flux layer on soldering joints can range from 1 to 100 µm.

The optimal thickness of the flux layer is between 2 and 50 µm.

The soldering joint can be circular, with a diameter ranging from 1 to 1,000 µm.

Alternatively, the soldering joint can be square, with side lengths ranging from 1 to 1,000 µm.

The spacing between adjacent soldering joints can range from 20 to 100 µm.

The flux can also be applied through printing techniques.

Compared to conventional methods, this invention allows precise adjustment of flux distribution. It remains effective even for smaller and more densely spaced soldering joints, ensuring that flux is confined to the joint surfaces. Additionally, laser cleaning minimizes residual flux on the circuit board, which can be completely removed during the reflow process. This eliminates the need for surface cleaning, simplifying production and reducing costs.

BRIEF DESCRIPTION OF THE DRAWINGS

The invention will become clearer through the following detailed description, with reference to the accompanying drawings.

DETAILED DESCRIPTION OF THE PREFERRED EMBODIMENT

The following description, accompanied by the drawings, illustrates the technical details of the invention. It should be understood that references such as "mounted," "fixed to," or "connected" imply both direct and indirect arrangements. Positional descriptions (e.g., up, down, left, right) are relative and apply to the illustrated embodiments.

Unless specified otherwise, all terms are used in their standard meanings, as recognized by those skilled in the art. Terms like "and/or" indicate any combination of the listed elements.

The invention provides a method for precisely adjusting flux distribution on a circuit board to facilitate solder bump formation. Flux is initially applied to the soldering joints, which are then subjected to laser cleaning to remove excess flux.

Figure 1:
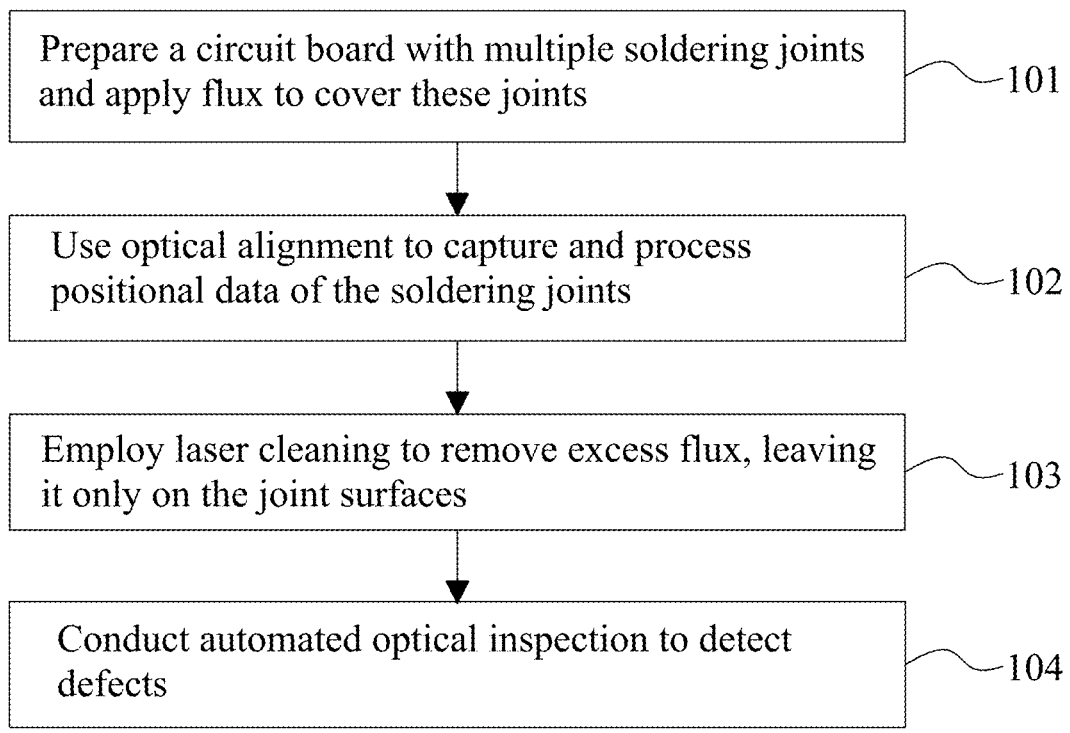
FIG. 1: A flowchart of the invention's method.

FIG. 1 outlines the steps of the invention:

Step 101: Prepare a circuit board with multiple soldering joints and apply flux to cover these joints.

Step 102: Use optical alignment to capture and process positional data of the soldering joints.

Step 103: Employ laser cleaning to remove excess flux, leaving it only on the joint surfaces.

Step 104: Conduct automated optical inspection to detect defects.

Figure 2:
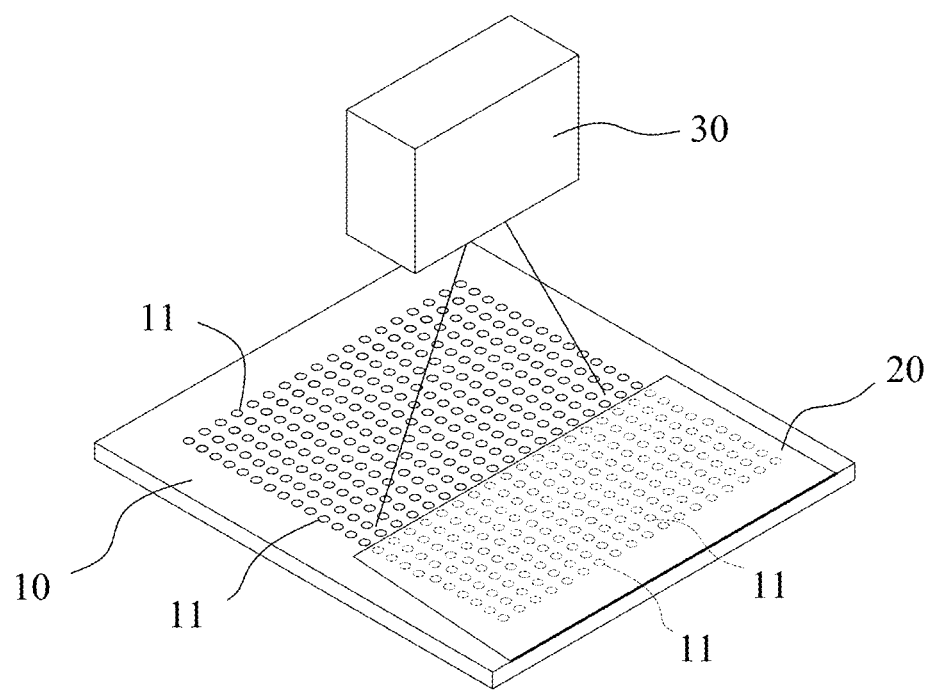
FIG. 2: Schematic view of flux application on a circuit board.

Next, refer to FIGS. 2 to 5 for a detailed description of each step of the present invention:

As illustrated in FIG. 2, the circuit board 10 utilized in the present invention features a plurality of soldering joints 11 arranged in a distributed pattern. This embodiment is specifically applied to surface mount technology (SMT), which directly mounts electronic components with no pins or short leads onto the circuit board 10. As a result, numerous soldering joints 11 are densely distributed on the circuit board 10 to correspond with the associated electronic components. In this example, the spacing between adjacent soldering joints 11 ranges from 20 to 100 μm, and the joints are both numerous and tightly packed. The shape of each soldering joint may be circular or square, with circular joints having a diameter of 1 to 1000 μm, and square joints having side lengths of 1 to 1000 μm. During step 101, as depicted in FIG. 2, an inkjet device 30 is employed to deposit a layer of flux 20 onto the surface of the circuit board 10. In the illustration, soldering joints 11 already covered by flux 20 are represented by dashed lines, while uncovered soldering joints 11 are shown as solid lines. Once the inkjet operation is complete, all soldering joints 11 are uniformly coated with the flux 20 layer.

Figure 3:
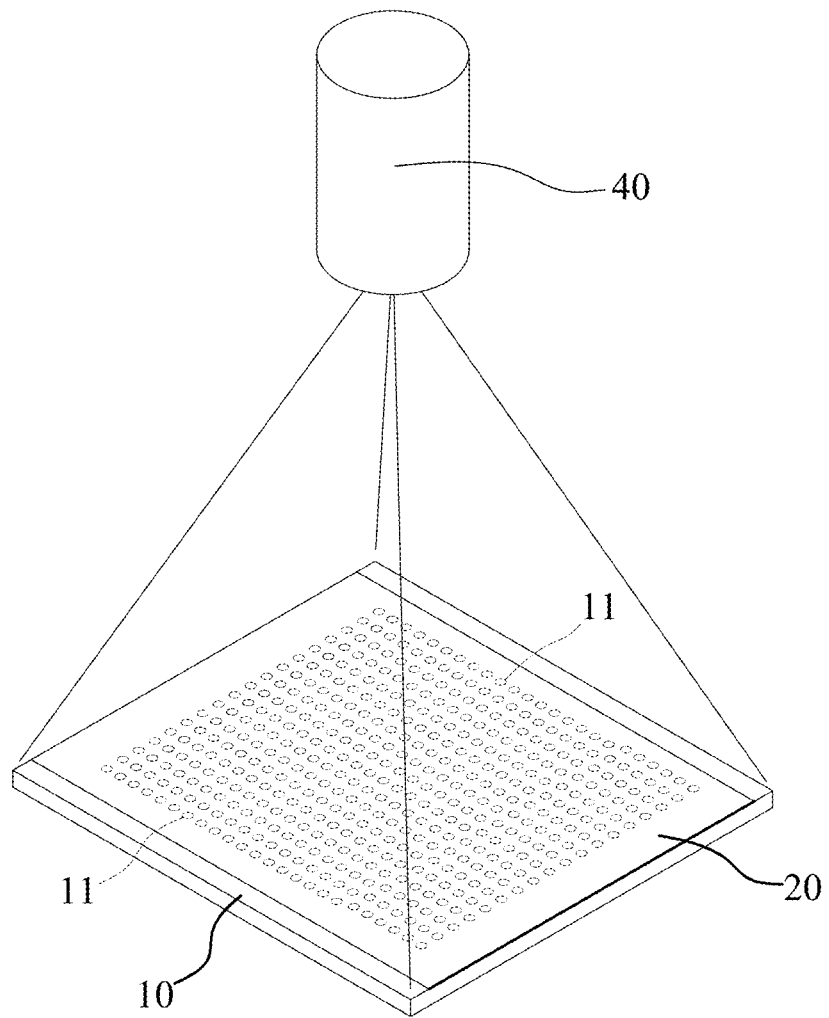
FIG. 3: Schematic view of optical alignment on the circuit board.

As shown in FIG. 3, step 102 involves using an optical camera 40 to capture an image of the circuit board 10. The captured image is aligned based on alignment markers or symbols (not depicted) on the circuit board 10 to calculate the board's coordinate information within the working area. Concurrently, the system retrieves the distribution positions of the soldering joints 11 from a connected database. This data is compiled and calibrated to generate precise position information, serving as a foundation for subsequent laser operations by the laser generator 50. Furthermore, the optical camera 40 can capture an identification code (e.g., a QR code) embedded on the circuit board 10. This code is cross-referenced with the database to confirm the circuit board's identity, minimizing the risk of processing errors.

Figure 4:
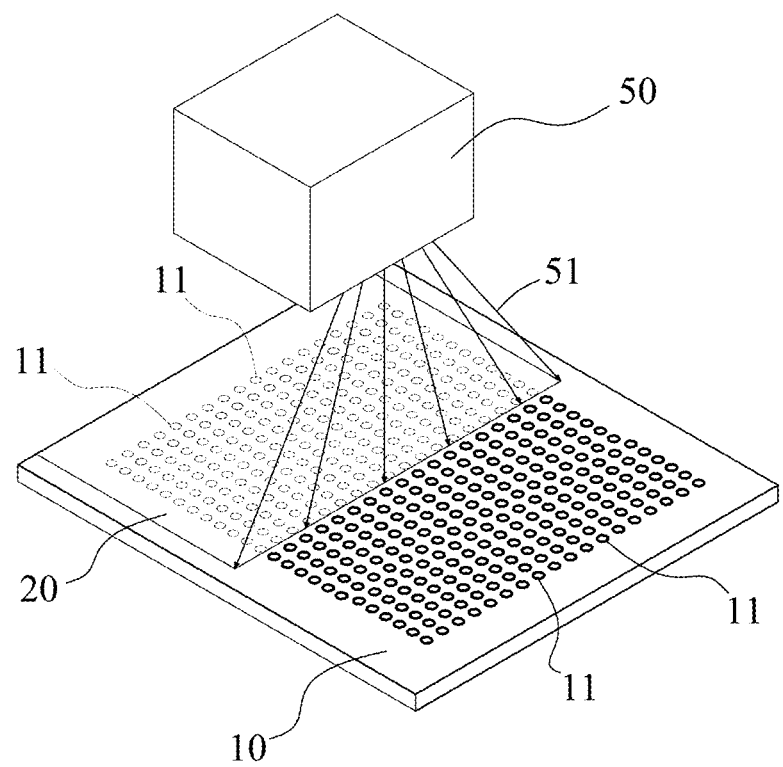
FIG. 4: Schematic view of laser cleaning operation.

As illustrated in FIG. 4, during step 103, the laser generator 50 emits laser light 51 with a wavelength of 355 nm, power of 5 W, pulse energy of 100 μJ, and frequency of 20 to 200 kHz, at speeds ranging from 1 to 5000 mm/sec. The laser light 51 removes excess flux 20 around the soldering joints 11 based on the previously determined position information, leaving flux 20 solely on the top surfaces of the soldering joints 11. In the diagram, soldering joints 11 with flux 20 are indicated by bold lines. In this embodiment, the flux 20 layer's thickness ranges from 1-100 μm, with an optimal thickness of 2 to 50 μm.

Figure 5:
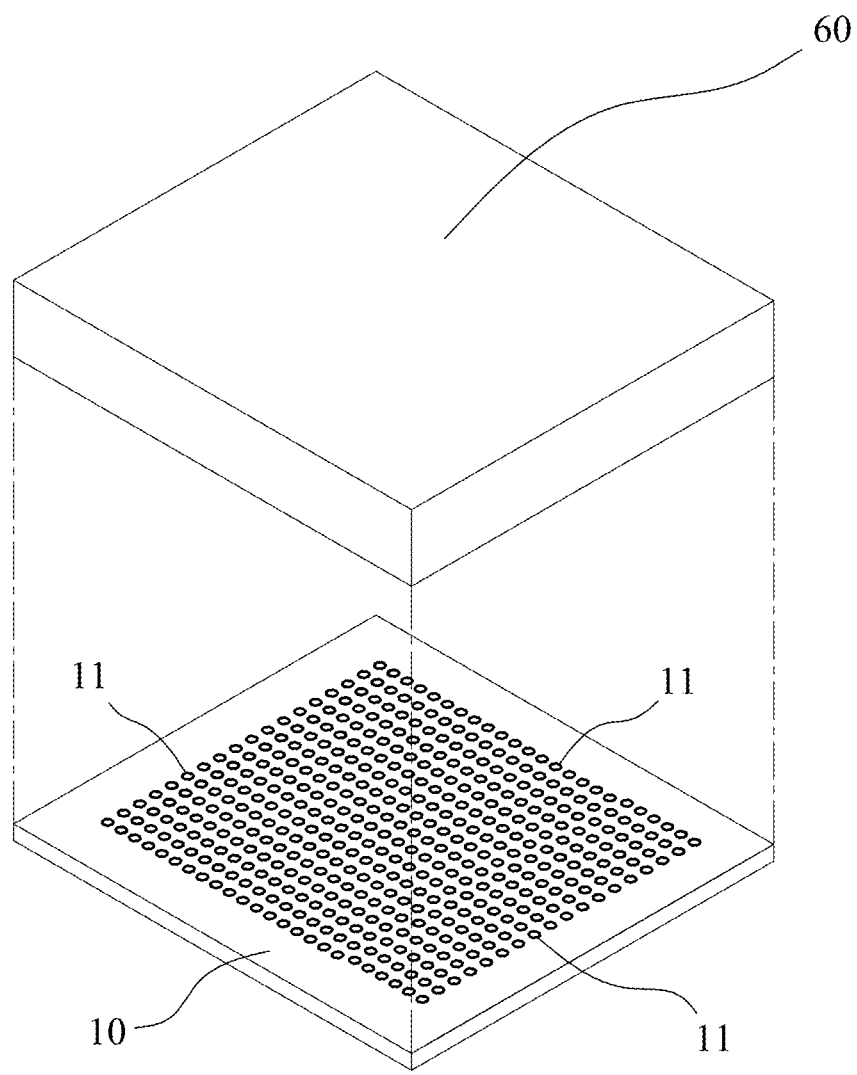
FIG. 5: Schematic view of automated optical inspection.

As illustrated in FIG. 5, step 104 involves automated optical inspection (AOI) to ensure quality control. The manufacturer selects suitable AOI equipment 60, represented as a square in the diagram. This equipment features a high-speed, high-precision optical imaging system that leverages machine vision to assess the flux 20's thickness, placement, and coverage on the soldering joints 11. If all soldering joints 11 are adequately coated with flux 20, the circuit board 10 is deemed a satisfactory product. Otherwise, defective boards, identified by insufficient or misaligned flux coverage, are flagged for cleaning and reprocessing. Approved boards proceed to the next stage of production.

To summarize, the present invention provides a method for adjusting flux distribution positions on a circuit board by employing optical alignment and laser cleaning techniques. Using laser light 51, excess flux 20 around soldering joints 11 on the circuit board 10 is precisely removed. By initially forming a thin layer of flux 20 via an inkjet method, the excess flux can be effectively and reliably eliminated, enabling accurate control over the removal area. This ensures that the flux 20 remains exclusively on the top surfaces of the soldering joints 11, addressing the challenge of achieving precise flux positioning as soldering joint size and spacing decrease. This method facilitates subsequent solder bump formation on the soldering joints 11.

In step 101, the invention primarily employs an inkjet method to apply the flux 20 layer onto the circuit board 10. However, the invention is not limited to inkjet technology; other methods, such as printing, can also be used. In another preferred embodiment, screen printing using a steel plate is applied to deposit the flux 20.

Figure 6:
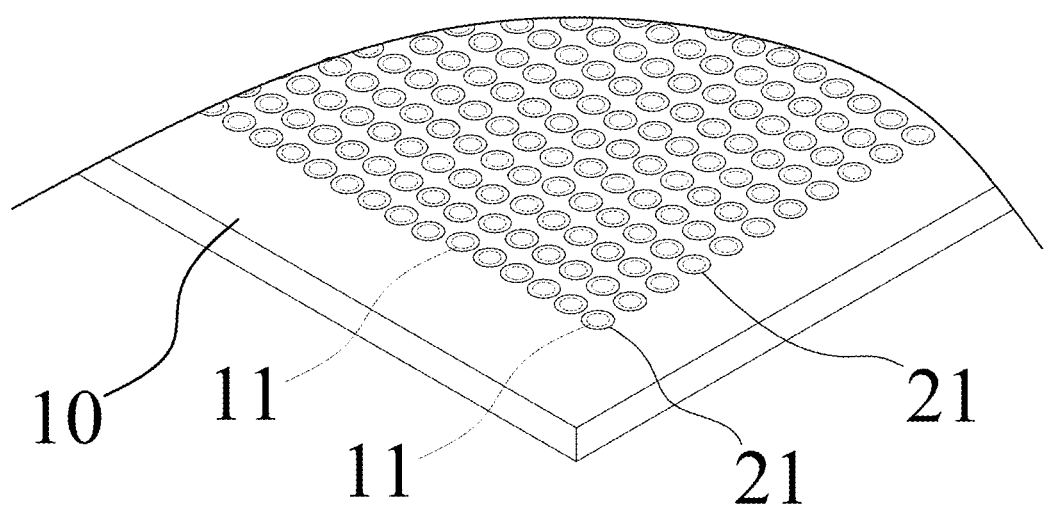
FIG. 6: Enlarged view of flux applied using the inkjet method.

When the inkjet method is used, it offers precise control over the flux distribution area. As shown in FIG. 6, the flux 20 distribution area 21 corresponds directly to the location of each soldering joint 11. For applications involving surface mount technology (SMT), where soldering joints 11 are small and spaced only 20 to 100 μm apart, the flux 20 distribution area 21 may initially exceed the dimensions of the soldering joints. Under such conditions, this invention adjusts and corrects the flux 20 distribution size and shape to match the soldering joints. By spraying only small amounts of flux 20 specific to each soldering joint 11, this method further reduces material usage, effectively lowering production costs.

In conclusion, this invention achieves highly accurate flux deposition, ensuring the flux 20 conforms to the shape of each soldering joint 11. Afterward, the soldering joints 11 with flux 20 are processed in a reflow oven to form solder bumps. By utilizing laser light 51 to clean excess flux 20, the remaining flux on the circuit board 10 is minimal. During the soldering process in the reflow oven, the high temperature completely removes the residual flux 20, eliminating the need for additional cleaning. This simplifies the production process and reduces cleaning costs.

Although the invention has been described in detail with reference to preferred embodiments, it is apparent to those skilled in the art that various modifications and alterations can be made without departing from the scope of the invention, as defined by the appended claims.

What is claimed is:

1. A method for adjusting flux distribution positions on a circuit board, comprising:

preparing a circuit board with a plurality of soldering joints distributed on a surface of the circuit board and applying a layer of flux to cover the soldering joints;

performing optical alignment by positioning the circuit board in a working area, capturing an image of the circuit board with an optical camera, and calculating position information;

performing laser cleaning by using a laser generator to emit laser light to remove excess flux around the soldering joints based on the position information, leaving flux only on top surfaces of the soldering joints; and conducting automated optical inspection to determine whether the circuit board is defective.

2. The method of claim 1, wherein the flux layer covers multiple soldering joints simultaneously during preparation.

3. The method of claim 1, wherein each soldering joint is initially covered with flux, with the flux coverage area exceeding the soldering joint's dimensions.

4. The method of claim 2, wherein the flux is applied using an inkjet method.

5. The method of claim 1, wherein the flux layer has a thickness of 1-100 μm.

6. The method of claim 5, wherein the preferred flux thickness is 2-50 μm.

7. The method of claim 1, wherein the soldering joints are circular, with diameters ranging from 1-1000 μm.

8. The method of claim 1, wherein the soldering joints are square, with side lengths ranging from 1-1000 μm.

9. The method of claim 1, wherein a spacing between adjacent soldering joints is 20-100 μm.

10. The method of claim 2, wherein the flux is applied using a printing method.

* * * * *